United States Patent
Crummenauer et al.

(10) Patent No.: US 12,331,397 B2
(45) Date of Patent: Jun. 17, 2025

(54) COATED FORMING TOOLS WITH ENHANCED PERFORMANCE AND INCREASED SERVICE LIFE

(71) Applicant: Oerlikon Surface Solutions AG, Pfäffikon, Pfäffikon (CH)

(72) Inventors: Juergen Crummenauer, Offweiler (DE); Robin Sedlag, Langenfeld (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 807 days.

(21) Appl. No.: 17/615,076

(22) PCT Filed: May 29, 2020

(86) PCT No.: PCT/EP2020/064966
§ 371 (c)(1),
(2) Date: Nov. 29, 2021

(87) PCT Pub. No.: WO2020/239976
PCT Pub. Date: Dec. 3, 2020

(65) Prior Publication Data
US 2022/0243318 A1    Aug. 4, 2022

Related U.S. Application Data

(60) Provisional application No. 62/853,969, filed on May 29, 2019.

(51) Int. Cl.
*C23C 16/34* (2006.01)
*C23C 8/24* (2006.01)
(Continued)

(52) U.S. Cl.
CPC .............. *C23C 16/345* (2013.01); *C23C 8/24* (2013.01); *C23C 16/36* (2013.01); *C23C 28/044* (2013.01); *C23C 28/046* (2013.01)

(58) Field of Classification Search
None
See application file for complete search history.

(56) References Cited

U.S. PATENT DOCUMENTS

| | | | |
|---|---|---|---|
| 2012/0196137 A1* | 8/2012 | Vetter | C23C 14/0605 106/286.6 |
| 2013/0071580 A1* | 3/2013 | Weidman | C23C 16/36 427/535 |
| 2017/0029956 A1 | 2/2017 | Domnick et al. | |

FOREIGN PATENT DOCUMENTS

| | | |
|---|---|---|
| EP | 1382709 A1 | 1/2004 |
| JP | 2000178738 A | 6/2000 |

(Continued)

OTHER PUBLICATIONS

Lazauskas et al., "Surface morphology, cohesive and adhesive properties of amorphous hydrogenated carbon nanocomposites films," Applied Surface Science, vol. 276, pp. 543-549 (2013). (Year: 2013).*

(Continued)

*Primary Examiner* — Ha S Nguyen

(57) ABSTRACT

Coated forming tool for processing of plastics materials or aluminum or aluminum alloy materials, comprising a substrate having a substrate surface, wherein the substrate surface is coated with a coating formed of one or more layers, wherein the coating comprises a Si—C—N-based layer having element composition in atomic percentage corresponding to $Si_aC_bN_cX_d$ with $50<a+b+c\leq100$, $0\leq d<60$, preferably $0\leq d<50$, wherein X is one or more elements selected from the elements hydrogen, oxygen, titanium, chromium, and/or aluminum.

12 Claims, 2 Drawing Sheets

(51) Int. Cl.
    *C23C 14/06*     (2006.01)
    *C23C 16/36*     (2006.01)
    *C23C 16/50*     (2006.01)
    *C23C 28/00*     (2006.01)
    *C23C 28/04*     (2006.01)

(56) References Cited

FOREIGN PATENT DOCUMENTS

| | | | |
|---|---|---|---|
| JP | 2001277251 | A | 10/2001 |
| JP | 2004283995 | A | 10/2004 |
| JP | 2006051510 | A | 2/2006 |
| JP | 2018525526 | A | 9/2018 |
| WO | 2005089990 | A1 | 9/2005 |

OTHER PUBLICATIONS

"Extrusion: Beschichtete Dusenoberflächen vermeiden Korrosion und Verschleiss," Blasformen & Extrusionswerkzeuge, 2008, pp. 8-10, vol. Jun. 2008 www.fachverlag-moeller.de.

S. Itasse "Neuartige Beschichtung verzehnfacht Standzeit von Spritzgiesswerkzeug, " https://www.maschinenmarkt.international/, Sep. 22, 2015.

V.I. Ivashchenko, et al. "Characteristics of Thin Plasmachemical Silicon Carbon Nitride Films Deposited Using Hexamethyldisilane," Powder Metallurgy and Metal Ceramics, 2009, pp. 66-72, vol. 48 Nos. 1-2, Springer Science+Business Media, Inc.

Baiqing, Wang, et al.; "The Study on PECVD process and the Characteristics of SiCxNy Film"; 1994-2023 China Academic Journal Electronic Publishing House; http://www.cnki.net; 3 pages; Abstract in English only.

Japan office Action for JP Application 2021-570934, mailed Apr. 23, 2024; 10 pages.

\* cited by examiner

COATED FORMING TOOLS WITH ENHANCED PERFORMANCE AND INCREASED SERVICE LIFE

TECHNICAL FIELD

The present invention relates to coated forming tools, which are especially advantageous for processing of plastics or for processing of aluminum or aluminum alloys. Such processing operations can include for example plastics injection molding as well as aluminum (or aluminum alloy) die casting. The inventive coated forming tools allows attaining better performance as well as a significantly increased service life compared to coated forming tools that are known in the state of the art.

The term "forming tools" in the context of the present invention has to be understood as referred to any kind of forming tools or parts of forming tools, including molds or parts of molds, which have surfaces that are intended to be in contact with the material to be processed, e.g. to be in contact with plastics material in a plastics processing operation or to be in contact with aluminum (or an aluminum alloy material) in an aluminum (or aluminum alloy) processing operation.

STATE OF THE ART

The use of coatings in forming tools for improving performance of the forming tools is already known.

In the article titled "Extrusion: Beschichtete Düsenoberflächen vermeiden Korrosion and Verschleiss", which was published in the magazine "Blasformen & Extrusionswerkzeuge" edition June 2008, it is reported that chemical nickel coatings applied of nozzle surfaces for extrusion of plastics offer considerable advantages regarding corrosion and wear resistance compared to other coatings.

One of the most important advantages of these chemical nickel coatings should be that they can be deposited true to contours on surfaces of tools or components to be coated. They should make possible uniformly coating of complex geometries, also of bore holes and depressions. The process temperature during deposition of these coatings is maximal 90° C. It was also reported the service life attained by using chemical nickel coatings was at least twice as much compared with by using coatings produced by chromium plating. Furthermore, it was reported that usual troubles that emerge during removal of plastic articles of the type polypropylene (PP) white from blow molds can be avoided with such kind of chemical nickel coatings, in particular by using a coating called "Chemisch-Nickel-PTFE".

In the article titled "Neuartige Beschichtung verzehnfacht Standzeit von Spritzgiesswerkzeug", written by Stéphane Itasse and published in the home page of the specialized medium MaschinenMarkt on Sep. 22, 2015, it is reported that the coating Balinit A of the company Oerlikon Balzers was used for coating die casting molds and with this coating it was possible to increase the service life in a factor of ten.

However, for meeting the very high exigencies resulted from the increasing demand for productivity, economy and manufacturing process reliability, it is necessary to provide new solutions.

Objective of the Present Invention

The objective of the present invention is to provide a solution for increasing productivity, economy and manufacturing process reliability in forming operations, preferably in plastics processing operations and/or aluminum processing operations. The solution should preferably result in a considerably increment of service life of the forming tools being used in the corresponding processing operation.

SUMMARY OF THE PRESENT INVENTION

The objective of the present invention is attained by providing a forming tool, in particular a substrate, comprising a substrate surface coated with a coating comprising a Si—C—N-based layer comprising silicon, carbon and nitrogen as main components.

The element composition of the layer according to the present invention can be expressed as following:

$Si_a C_b N_c X_d$ with $50 < a+b+c \leq 100$, $0 \leq d < 60$, preferably $0 \leq d < 50$, and wherein X can be one or more elements selected from following group of elements: H, O; Ti, Cr, Al. It can be a preferred embodiment if $0 \leq d < 55$, it can be a more preferred embodiment if $0 \leq d < 50$, it can be still a more preferred embodiment if $0 \leq d < 45$, or it can be a more preferred embodiment if $0 \leq d < 40$.

Preferably X comprises hydrogen, or oxygen, or hydrogen and oxygen.

Preferably X comprises titanium, or chromium, or aluminum, or a combination of titanium, chromium and/or aluminum.

According to a preferred embodiment X correspond to the elements H and O.

Furthermore, by doping the Si—C—N-based layer (silicon carbonitride based layer) with metal atoms like Ti, Cr and/or Al it is possible to attain additional benefits in terms of coating properties. These metal elements can be incorporated in the coating for example by using typical CVD precursors like TiCl4, AlCr3 and/or metal organic precursors.

Especially good results can be obtained in a preferred embodiment by using inventive Si—C—N-based layer having element composition $Si_a C_b N_c X_d$ with $60 < a+b+c \leq 100$, $0 \leq d < 60$. It can be a preferred embodiment if $0 \leq d < 55$, it can be a more preferred embodiment if $0 \leq d < 50$, it can be still a more preferred embodiment if $0 \leq d < 45$, or it can be a more preferred embodiment if $0 \leq d < 40$.

In order to explain the invention in more detail, some examples and preferred embodiments of the invention will be described.

FIGS. 1 to 4 should help to understand some examples and preferred embodiments of the present invention.

BRIEF DESCRIPTION OF THE DRAWINGS

The examples and preferred embodiments in the following description of the present invention should not be understood as a limitation of the invention but as showcases for better understanding of the invention.

DETAILED DESCRIPTION OF THE INVENTION

The inventors found out that especially good improvements in performance and service life of forming tools, in particular in plastics processing operations and aluminum processing operations can be attained if the Si—C—N-based layer 3 is deposited as outermost layer of the coating 2.

The inventive Si—C—N-based layer 3 is preferably deposited exhibiting:
An amorphous layer structure, and/or
No droplets (droplets are normally formed in coatings that are deposited by means of physical vapor deposition (PVD) processes, in particular by using unfiltered arc evaporation deposition processes), and/or
High corrosion resistance.

Preferably the inventive Si—C—N-based layer 3 exhibits all the above listed properties at the same time.

By depositing the inventive Si—C—N-based layer 3 as top layer of the coating 2, it is possible further to attain following additional benefits:
No chemical reaction (inertness) of the forming tool material during contact with plastics materials being processed, and/or
Reduction of tendency of the forming tool material to stick to molten plastics during processing.

Figure 1:
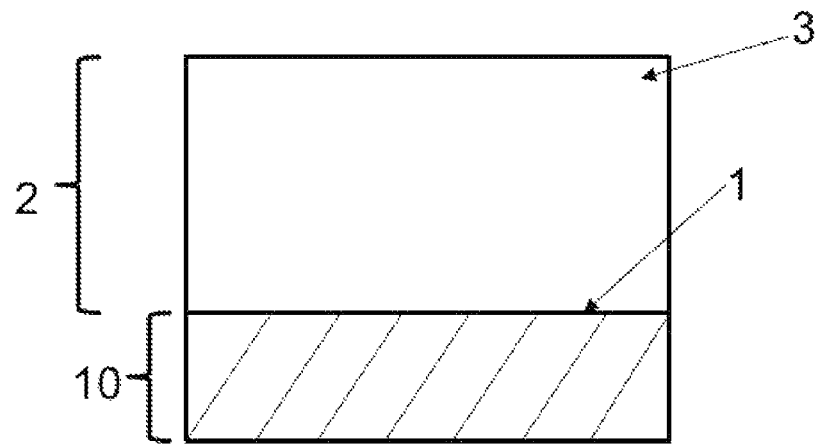
FIG. 1: shows schematically the architecture of a coating system deposited on a substrate surface 1 of a substrate 10 of a forming tool according to the present invention, wherein the coating 2 is deposited as monolayer on the substrate surface 1, i.e. the coating 2 is formed of only one layer, wherein the layer is a Si—C—N-based layer 3.

According to a preferred first embodiment of the present invention the coating 2 consists of only one Si—C—N-based layer 3. In this case, the Si—C—N-based layer 3 can be deposited directly on the substrate surface 1 as it is shown in FIG. 1. It can be beneficial that additionally an adhesion layer 6 can be deposited between the substrate surface 1 and the Si—C—N-based layer 3 that constitutes the coating 2 for improving adhesion of the coating 2 to the substrate surface 1.

By providing an inventive coating on forming tools according to this first embodiment (see e.g. FIG. 1) following advantages are attained:
Inertness (no chemical reaction) during contact with plastics material, and/or
Improved corrosion resistance compared to low alloyed bulk materials (e.g. with chromium 5 wt.-%) used for manufacturing forming tools (e.g. tempered tool steels such us heat-treatable cold work tool steels 1,2311 and 1,2312; hardened tool steels such as hot work tool steels 1.2343 and 1.2344; nitriding steels such us heat-treatable steels 1,7735, 1,8519 and 1,8550).

Preferably the first embodiment attains all the above listed advantages at the same time.

Figure 2:
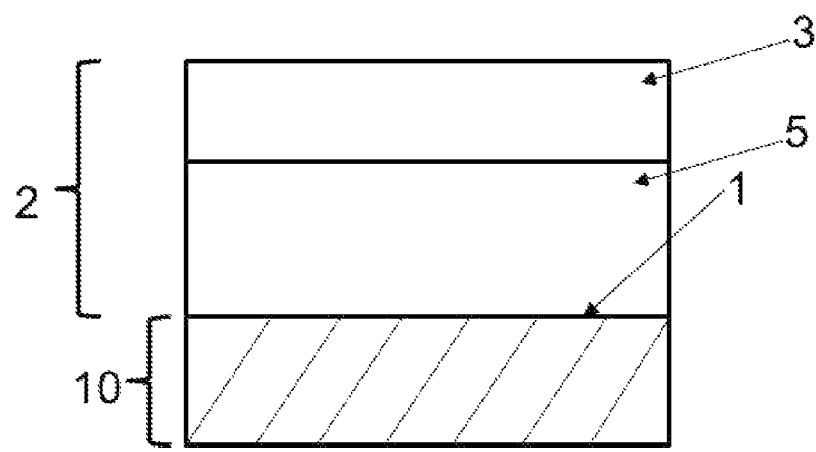
FIG. 2: shows schematically the architecture of a coating system in a another embodiment of the invention deposited on a substrate surface 1 of a substrate 10 of a forming tool according to the present invention, wherein the coating 2 is deposited as multilayer on the substrate surface 1, i.e. the coating 2 is formed of more than one layer, wherein the Si—C—N-based layer is deposited as top layer and between the substrate surface 1 and the Si—C—N-based layer 3, a hard-thin film layer 5 is deposited.

According to a further preferred second embodiment of the present invention the coating 2 is deposited having a multilayer architecture, which comprises at least two layers, wherein one of the layers is a Si—C—N-based layer 3 deposited as outermost layer, preferably top layer, as it is shown in FIG. 2. In this case, a first layer 5 of the multilayer architecture can be deposited directly on the substrate surface 1 as it is shown in FIG. 2. In the case shown in FIG. 2 the first layer 5 is deposited between the substrate surface 1 and the Si—C—N based layer 3. In this embodiment it can be beneficial that an adhesion layer 6 (not shown in FIG. 2) is deposited between the substrate surface 1 and the first layer 5 of the multilayer architecture that is constituting the coating 2 in this embodiment, wherein the adhesion layer 6 is used for improving adhesion of the coating 2 to the substrate surface 1.

By providing an inventive coating on forming tools according to this second embodiment (see e.g. FIG. 2) following advantages are attained:
Inertness (no chemical reaction) during contact with plastics material, and/or
Improved corrosion resistance compared to low alloyed bulk materials (e.g. with chromium 5 wt.-%) used for manufacturing forming tools (see examples of typical forming tools materials above), and/or
Increased total coating hardness by including hard coating layers (e.g. metal nitride layers) in the multilayer structure that is forming the coating 2, for example by including a PVD-deposited nitride layer as first layer 5 of the coating 2), and/or
Improved contact pressure per unit area regarding hard particle in plastic.

Preferably the second embodiment attains all the above listed advantages at the same time.

For understanding the term "improved contact pressure" better, following example will be explained:

With the first layer 5 a support for the top layer 3 (Si—C—N based layer 3) is given e.g. if the first layer 5 is thicker than 5 μm, preferably thicker than 10 μm and harder than the top layer 3. In plastic are e.g. hard particles. By forming the plastic in the coated forming tool the danger exist that the hard particles of the plastic can brake in the top layer 3, in particular if no support below the top layer 3 exists and in particular if the bulk material doesn't have more e.g. than 550 HV surface hardness. With the first layer 5 and preferably an additional nitriding layer 4 of the substrate 1 surface (see FIGS. 3 and/or 4 and preferably third embodiment of the present invention described below) the contact pressure per unit area can improved regarding the hard particles in e.g. plastic forming.

Figure 3:
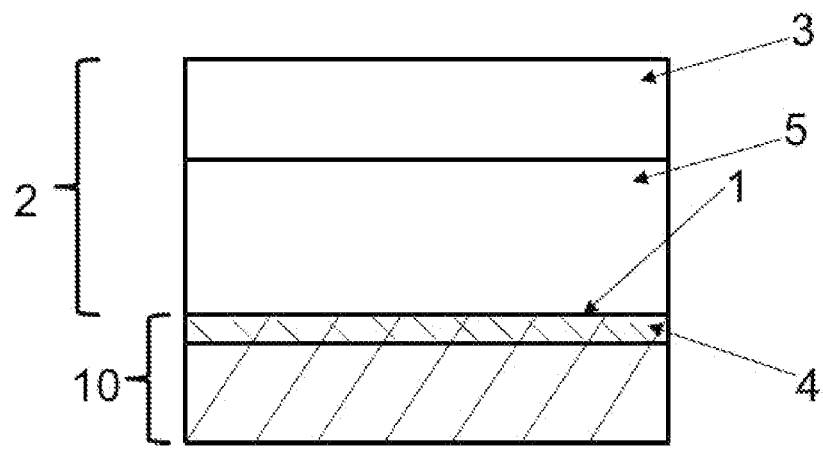
FIG. 3: shows schematically the architecture of a coating system in a another embodiment of the invention deposited on a substrate surface 1 of a substrate 10 of a forming tool according to the present invention, wherein the coating 2 is deposited as multilayer on the substrate surface 1, i.e. the coating 2 is formed of more than one layer, wherein the Si—C—N-based layer 3 is deposited as top layer, wherein the substrate 10 comprises a nitriding layer 4, wherein the nitriding layer 4 preferably forms the substrate surface 1, and wherein the hard-thin film layer 5 is deposited between the nitriding layer 4 and the Si—C—N-based layer 3.
Figure 4:
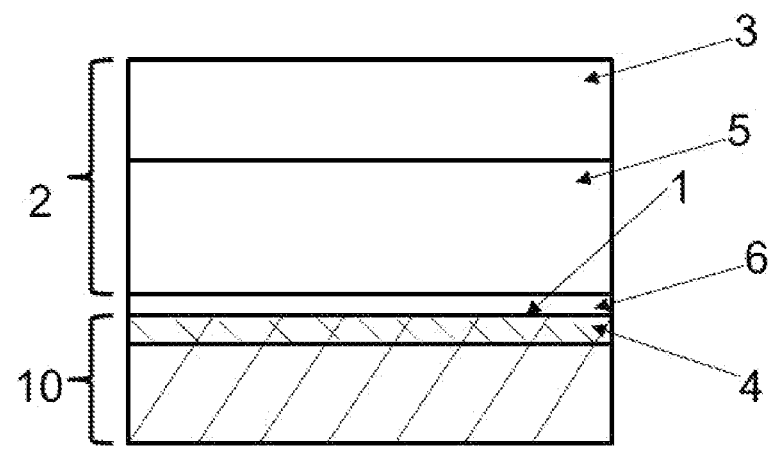
FIG. 4: shows schematically the architecture of a coating system in another embodiment of the invention deposited on a substrate surface 1 of a substrate 10 of a forming tool according to the present invention, wherein the coating 2 is deposited as multilayer on an adhesion layer 6, wherein the substrate 10 comprises a nitriding layer 4, wherein the nitriding layer 4 preferably forms the substrate surface 1, wherein the adhesion layer 6 is deposited on the nitriding layer 4, which as mentioned above preferably comprises the substrate surface 1, wherein the Si—C—N-based layer 3 is deposited as top layer and a hard-thin film layer 5 is deposited between the adhesion layer 6 and the Si—C—N-based layer 3.

According to a further preferred third embodiment of the present invention the substrate surface 1 is treated in such a manner that a nitriding layer 4 is formed at the surface of the substrate 10, so that the nitriding layer 4 comprises the substrate surface 1. In this manner the coating 2 is deposited on the nitriding layer 4 comprising the substrate surface 1 (as it is shown in FIG. 3). It can be beneficial that the coating 2 is deposited on an adhesion layer 6 that is deposited on the nitriding layer 4 comprising the substrate surface 1 (as it is shown in FIG. 4). The adhesions layer architecture shown in FIG. 4 seem to be useful and promising.

By providing an inventive coating on forming tools according to this third embodiment (see e.g. FIG. 3 or FIG. 4) following advantages are attained:

- Additional improvement for the contact pressure per unit area regarding hard particle in plastic (a higher contact pressure in comparison with the embodiment drafted in FIG. 2), and/or
- Improved mechanical stability of the substrate-coating system by providing a better supporting effect of the coating on the forming tool substrate material that usually is a steel with a hardness (e.g. steel hardness ≤550HV) considerably lower than the hardness of the coating, and/or
- Improved mechanical strength at high temperatures (There is no loss of the positive mechanical properties in the nitriding layer 4 up to 500° C., wherein the high hardness is conserved also at 500° C. working temperature), and/or
- Improved the cracking behavior/extension (The cracking propagation into the bulk is improved. The cracks stop mostly at the nitriding layer 4, preferably at the end of the nitriding depth, caused by the induced internal stress regarding the storage of nitrogen in the surface zone. Top layer 3 and first layer 5 preferably channel the cracks parallel to the surface and protect the substrate)

Preferably the third embodiment attains all the above listed advantages at the same time.

The inventors found out that surprisingly forming tools coated or treated and coated according any of the above-mentioned preferred third embodiment (see also FIGS. 3 and/or 4) can attain a more considerably increased service life by depositing the coating 2 comprising at least one corrosion resistant layer (e.g. a hard-thin-film layer 5 exhibiting good corrosion resistance) deposited between the Si—C—N-based outermost layer 3 and the substrate surface 1 (depending on the case the corrosion resistance 5 layer can be deposited for example between the Si—C—N-based outermost layer 3 and an adhesion layer 6 or between the Si—C—N-based layer 3 and a nitriding layer 4 comprising the substrate surface 1).

The hard thin film layer 5 is preferably a metal nitride layer or a metal oxide layer or a metal oxynitride layer or a metal carboxynitride layer or a metal carbonitride layer. The hard-thin film layer 5 preferably has a chemical composition in atomic percentage corresponding to the formula $Me(C_vN_yO_z)_q$, with Me being one or more elements selected from a group of elements composed by chromium, aluminum, titanium, vanadium and molybdenum, and with atomic fractions v, y and z of carbon, nitrogen and oxygen, respectively, having a value in the following ranges $0 \leq v \leq 1$, $0 \leq y \leq 1$, $0 \leq z \leq 1$, with $v+y+z=1$, and with mol concentration q of the nonmetallic elements C, N and O in relation to one mol of the metallic elements Me in following range $0.76 \leq q \leq 1.2$.

The corrosion resistant layer is preferably a chromium nitride layer or a chromium nitride-based layer. In the context of the present description of the invention a chromium nitride-based layer is a layer containing chromium nitride, wherein the sum of the chromium content and nitrogen content in the chromium nitride-based layer constitutes more than 50% in atomic percentage taking into account all elements present in the chromium nitride-based layer. A chromium nitride layer or a chromium nitride-based layer used as corrosion resistance layer in the context of the present invention can be performed exhibiting a monolayer structure or a multilayer structure. According to a preferred embodiment, the corrosion resistant layer is performed as a chromium nitride layer exhibiting a multilayer structure, wherein the multilayer structure comprises at least two types of chromium nitride layers, preferably two different types of chromium nitride layers, for example a first type of chromium nitride layer and a second type of chromium nitride layer, wherein one of the two types of chromium nitride layer comprises more nitrogen than the other and wherein the different types of layers are deposited alternate one on each other.

According to a preferred variant of the embodiment including a corrosion resistance layer, the Si—C—N-based layer 3 is deposited directly on the corrosion resistance layer.

According to a preferred variant of the embodiment including a corrosion resistance layer, the corrosion resistance layer is deposited directly on the substrate surface 1 or directly on a nitriding layer 4 comprising the substrate surface 1.

According to a further preferred embodiment of the present invention, thermochemical based diffusion layers with nitrogen and carbon as diffusion elements can be used as corrosion resistance layers.

One example of a preferred embodiment in which thermochemical based diffusion layers are used as corrosion resistance layers and stainless or martensitic steel is used as substrate material:

- For the treatment of austenitic and non-corrosive martensitic steels a preferred variant for producing the thermochemical based diffusion layer is by low temperature nitriding or low temperature nitrocarburizing or carburizing (low temperature in this context is for example a temperature within a range from 360° C. to 460° C.). The diffusion elements N and C create at low temperature nitrogen expanded austenite and martensite which improve the pitting corrosion.
- Following improvements are attained by including a Si—C—N-based layer 3 on top of the above mentioned thermochemical based diffusion layer:
- additional improvement of the corrosion resistance, and/or
- improved contact pressure per unit area regarding hard particles in plastics materials (caused by the high hardness of the nitriding zone >550HV), and/or
- improved mechanical stability by providing better support to a coating (e.g. the Si—C—N-based layer 3) provided on the thermomechanical based diffusion layer in comparison with a steel substrate with, preferably considerably, lower hardness than the coating.

Another example of a preferred embodiment in which thermochemical based diffusion layers are used as corrosion resistance layers and heat-treatable steels, carbon steels, case-hardening steels, nitriding steels or hot working steels is used as substrate material:

- For the treatment of such low alloyed steels a preferred variant for producing the thermochemical based diffusion layer is nitrocarburising with Fe (N, C)-nitride layers, preferred Epsilon-Nitride layer, as corrosion protection layer or nitrocarburising with post oxidation with the composite Epsilon Nitride as corrosion protection layer. The Si—C—N layer is preferably directly deposited on the Epsilon Nitride composite. Only optionally a magnetite as corrosion protection layer is used.

Following improvements are attained by including a Si—C—N-based layer 3 on top of the above mentioned thermochemical based diffusion layer:
additional improvement of the corrosion resistance, and/or
improved contact pressure per unit area regarding hard particles in plastics materials (caused by the high hardness of the nitriding zone >550HV), and/or
improved mechanical stability by providing better support to a coating (e.g. the Si—C—N-based layer) provided on the thermomechanical based diffusion layer in comparison with a steel substrate with, preferably, considerably, lower hardness than the coating, and/or
Improved mechanical strength at high temperatures, and/or
Improved the cracking behavior/extension (Improve the cracking propagation into the bulk material caused by the advantage that the nitriding layer stop the cracking process by the induced internal stress generated by the stored nitrogen in the surface zone), and/or
Reduction of tendency of the forming tool material to stick to molten plastics and non-ferrous metals such as aluminum and copper.

Preferably the above mentioned embodiment attains all the above listed improvements at the same time The inventors found out that Si—C—N-based layers 3 deposited by using plasma enhanced chemical vapor deposition (PE-CVD) techniques (these techniques are also known as plasma assisted chemical vapor deposition (PA-CVD) techniques) are especially beneficial for improving tool performance and service life.

For the PE-CVD deposition of the inventive Si—C—N layers 3, a gas comprising Si and C can be used. For example, hexamethyldisiloxane (HMDSO) in gas state can be used as precursor and nitrogen in gas state can be used as reactive gas for forming the Si—C—N-based layer. Si—C—N layers deposited in this manner exhibit particularly low surface roughness. For example, in one example, in which the substrate surface 1 exhibited an arithmetic mean roughness Ra=0.01 µm before coating, the arithmetic mean roughness attained after coating was Ra=0.04 µm with an inventive coating exhibiting architecture as shown in FIG. 1, in which the Si—C—N-based layer 3 was produced having a total layer thickness of 8 µm by using the PE-CVD as method mentioned above. In a further example, in which also the substrate surface 1 exhibited an arithmetic mean roughness Ra=0.01 µm before coating, the arithmetic mean roughness attained after coating was Ra=0.02 to 0.03 µm with an inventive coating exhibiting architecture as shown in FIG. 1, in which the Si—C—N-based layer 3 was produced having a total layer thickness of 2 to 3 µm by using the PE-CVD method as mentioned above.

The deposition of the inventive Si—C—N layers is however not limited to the above-mentioned method. The Si—C—N layers can also be deposited by any PVD method or reactive PVD method, for example:
by sputtering of targets comprising silicon, carbon and nitrogen in an argon-containing atmosphere or in a nitrogen-argon-containing atmosphere, or
by sputtering or arc-evaporation of targets comprising silicon and carbon in an nitrogen-containing atmosphere.

All the above-mentioned methods should be, however, understood as examples and not as a limitation of methods that can be used for deposition of the inventive Si—C—N layers.

For attaining a better performance of the forming tools, the coated or treated and coated forming tools according to the present invention preferably can be post-treated for attaining a desired surface quality. Some suitable post-treatments in this regard are for example:
Grinding with grinding grain of 1200 or finer, and/or
Glass bead blasting, and/or
Polishing with diamond paste.

The selection of the architecture and element composition of the coating system used for improving the performance and service life of the forming tool according to the present invention can be selected depending on:
the kind of plastics processing operation and/or the type of plastics material to be processed, or
the kind of aluminum processing operation and/or the type of aluminum alloy to be processed.

Inventive Example 1

Calibers for wet calibration for extrusion of window profiles were used as substrates.

The substrate materials used were: hot work tool steels 1.2311 and 1.2316.

The substrates were introduced in the interior of a coating chamber of a vacuum coating device for conducting a coating process according to the present invention. The coating was deposited on the substrates comprising two layers, a first layer 5 of chromium nitride and a second layer that is a Si—C—N-based layer 3. The first layer 5 was deposited directly on the surfaces of the calibers intended to be in contact with the material to be processed. The contact material to be in contact with the Si—C—N-based layer 3 was polyvinyl chloride (PVC).

The chromium nitride layer (hereafter also called CrN-layer) was deposited by using physical vapor deposition (PVD) techniques preferably of the type reactive cathodic arc evaporation. Hard material coating (chrome nitride) is preferably performed in a PVD system (Arc PVD or Magnetron PVD system). For deposition of the first layer 5, chromium targets were evaporated in a nitrogen containing atmosphere and a bias voltage, preferably a bias voltage of at least 50 V, preferably a bias voltage of maximal 300 volt, preferably a bias voltage between 50 and 300 V, was applied to the calibers.

Following process steps were conducted before and during deposition of the first layer 5 (in this example: a chromium nitride layer deposited by reactive cathodic arc PVD):
1. Evacuation to high vacuum
2. Heating up by thermal radiation up to 400° C.
3. Sputter cleaning by argon ion/metal ion bombardment
4. Operating the chromium targets as cathodes in a reactive cathodic arc evaporation process, using during this step a nitrogen argon gas mixture flow as process/reactive gas and applying a bias voltage to the substrates.

The second layer 3 was deposited as outermost layer by using PE-CVD. The deposition of the second layer 3 is preferably performed in a plasma nitriding system. For deposition of the second layer, HMDSO in gas state was used as precursor and nitrogen gas was introduced in the coating chamber and the deposition temperature (temperature of the substrate surface being coated during deposition process) was maintained at a value between 360° C., preferably 380° C. and 450° C., preferably 480° C.

Following process steps were conducted after deposition of the first layer 5 and during deposition of the second layer 3 (in this example: a Si—C—N-based layer deposited by PE-CVD):

5. Switching off the chromium targets, stopping gas flow entering in the coating chamber and drawing vacuum in the coating chamber.
6. Entering a hydrogen, nitrogen and argon gas mixture flow ($H_2$, $N_2$, and Ar gas mixture flow) in the coating chamber.
7. Switching on a glow discharge directly on the substrates (samples or forming tools) by increasing the BIAS voltage at the substrates till a value in a range of 500V to 600 V.
8. Switching on a vapor evaporator for HMDSO and dosage of 5% HMDSO to the $H_2$, $N_2$, and Ar gas mixture flow.

The second layer deposited in this manner resulted in a Si—C—N based layer 3 of the type $Si_a C_b N_c X_d$ with X are the elements hydrogen (H) and oxygen (O) and the coefficient d corresponds to the sum of the H-content and the O-content in the Si—C—N-based layer 3 in atomic percentage. Therefore, the element composition of this type of Si—C—N based layer 3 can be expressed as following:

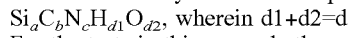, wherein d1+d2=d

For the tests in this example the resulted composition of the Si—C—N-based layer was concretely following: 

The CrN layer was deposited in this example having a multilayer structure Cr/CrN/Cr/CrN . . . and having layer thickness of the multilayer structure of 6-8 µm or having layer thickness of the multilayer structure of 8-10 µm (a preferred range of thickness for a such CrN layer or any other kind of $1^{st}$ layer is: 1 to 10 µm).

Preferably layer thicknesses of more than about 8 µm with very good adhesive strength can be deposited on the substrate 10 of a forming tool at preferably about 480° C. (see FIG. 1). The hardness of these layers is preferably in the order of 5000 HV0.1.

The corrosion resistance of about 2 µm thick layers is preferably at 144-188 h in the salt spray test. The tested architecture of this preferred embodiment is described in FIG. 1. The corrosion resistance of thicker layers is deemed to be at least as good as the 2 µm thick layers, preferably it is more resistant to corrosion, but is currently under testing.

According to a preferred embodiment of the CrN layer having multilayer structure, the stacking of the layers preferably always begins with Cr, followed by CrN and then for example five of these stacks. The ratio between Cr and CrN is preferably ⅕.

The Si—C—N-based layer 3 was deposited in this example having a layer thickness of 1-2 µm, wherein a preferred range of thickness for a such Si—C—N-based layer is 1 to 10 µm.

The so coated calibers showed after usage during 48 hours no visible signs of corrosion.

The description and claims of the priority application U.S. 62/853,969 from: 29 May 2019 on which that application is based shall preferably form an integral part thereof.

As described in this description one main goal is to deposit layers on tools used in the plastics and aluminium processing industries. Specifically, so far "Si—C—N based layer directly on a nitriding layer" have been investigated in the application temperature range from 360° C. to 480° C. for qualifications. PE-CVD or PA-CVD can be the preferred technology for the deposition of the Si—C—N layer. It can be preferable to treat the layer with glass beads or diamond paste. It is preferred, as described above in one of the embodiment, that the deposition process will initially be carried out in two different plants, wherein for example the hard material coating (chrome nitride) is deposited in a PVD system (Arc PVD or Magnetron PVD system), and wherein the deposition of Si—C—N is then carried out in a plasma nitriding system. The adhesions layer architecture shown in FIG. 4 and described above can be useful and promising.

The coating systems described above and in FIGS. 1 to 4 could also open up interesting fields of application for Precision Components due to their properties—in particular due to corrosion resistance, high hardness and non-conductivity. For example, for improving performance of machining metal components, stainless steel components and casting parts, as well as for improving performance of metal components for electronic applications, in particular due to the electrical insulating character of the inventive Si—C—N-based layer.

Irrespective of the claims, protection is also sought for the following items:

A coated forming tool for processing of plastics materials or aluminum or aluminum alloy materials, comprising a substrate 10 having a substrate surface 1 coated with a coating 2 formed of one or more layers, characterized in that, the coating comprises a Si—C—N-based 3 having element composition in atomic percentage corresponding to $Si_a$: $C_b N_c X_d$ with 50<a+b+c≤100, 0≤d<50, wherein X is one or more elements selected from a group of elements composed by the non-metallic elements hydrogen and oxygen, as well as the metallic elements titanium, chromium and aluminum.

A coated forming tool according to the preceding paragraph, characterized in that, the coating is formed of more than one layer and the Si—C—N-based layer 3 is deposited as outermost layer.

A coated forming tool according to any of the preceding paragraphs, characterized in that, the substrate surface 1 comprises a nitriding layer 4, on which the coating 2 is deposited.

A coated forming tool according to any of the preceding paragraphs, characterized in that, the coating 2 comprises a hard-thin film layer 5 that is deposited between the substrate surface 1 and the silicon carbonitride layer 3.

A coated forming tool according to the preceding paragraph, characterized in that, the hard thin film layer 5 is a metal nitride layer or a metal oxide layer or a metal oxynitride layer or a metal carboxynitride layer or a metal carbonitride layer, wherein the layer has chemical composition in atomic percentage corresponding to the formula $Me(C_v N_y O_z)_q$, with Me being one or more elements selected from a group of elements composed by chromium. aluminum, titanium, vanadium and molybdenum, and with atomic fractions v, y and z of carbon, nitrogen and oxygen, respectively, having a value in the following ranges 0≤v≤1, 0≤y≤1, 0≤z≤1, with v+y+z=1, and with mol concentration q of the nonmetallic elements C, N and O in relation to one mol of the metallic elements Me in following range 0.76≤q≤1.2.

A coated forming tool according to any of the preceding paragraphs, characterized in that, between the substrate surface 1 and the coating 2 an adhesion layer 6 is deposited.

A coated forming tool according to any of the preceding claims, characterized in that, the Si—C—N-based layer 3 comprises hydrogen and oxygen in addition to silicon, carbon and nitrogen.

A method for producing a coated forming tool according to any of the preceding paragraphs, characterized in that, the silicon carbonitride layer 3 is deposited by using PE-CVD techniques, wherein as precursor an Si-containing gas is used.

A method according to the preceding paragraph, characterized in that, the Si-containing gas is hexamethyldisiloxane (HMDSO).

A method according to any of the two preceding paragraphs, characterized in that, before deposition of the silicon carbonitride layer 3, the substrate 10 to be coated is subjected to a plasma nitriding process for forming a nitriding layer 4 comprising the substrate surface 1 on which the coating 2 is deposited.

Use of a coated forming tool according to any of the preceding paragraphs in a plastics processing operation.

Use according to the preceding paragraph, characterized in that the plastics processing operation is plastics injection molding.

Use of a coated forming tool according to any of the preceding paragraphs in an aluminum or aluminum alloy processing operation.

Use according to the previous paragraph, characterized in that the plastics processing operation is aluminum die casting or aluminum alloy die casting.

Irrespective of the claims, independently of the claims and/or in combination with any of the claims and/or in combination with one or more of the previous paragraphs, protection is also sought for a coated forming tool for processing of plastics materials or aluminum or aluminum alloy materials, comprising a substrate 10 having a substrate surface 1, wherein the substrate surface 1 is coated with a coating 2 formed of one or more layers, characterized in that the coating 2 comprises a Si—C—N-based layer 3 having element composition in atomic percentage corresponding to $Si_aC_bN_cX_d$ with $50<a+b+c\leq100$, $0\leq d<60$, preferably $0\leq d<50$, wherein X is one or more elements selected from the elements hydrogen, oxygen, titanium, chromium, and/or aluminum.

Irrespective of the claims, independently of the claims and/or in combination with any of the claims and/or in combination with one or more of the previous paragraphs, protection is also sought for a coated forming tool wherein X comprises hydrogen, or oxygen, or hydrogen and oxygen.

Irrespective of the claims, independently of the claims and/or in combination with any of the claims and/or in combination with one or more of the previous paragraphs, protection is also sought for a coated forming tool wherein X comprises titanium, or chromium, or aluminum, or a combination of titanium, chromium and/or aluminum.

Irrespective of the claims, independently of the claims and/or in combination with any of the claims and/or in combination with one or more of the previous paragraphs, protection is also sought for a coated forming tool wherein X is one or more elements selected from a group of elements composed by the non-metallic elements hydrogen and oxygen as well as the metallic elements titanium, chromium and aluminum.

The invention claimed is:

1. Coated forming tool for processing of plastics materials or aluminum or aluminum alloy materials, comprising:
   a substrate having a substrate surface, wherein the substrate surface is coated with a coating formed of one or more layers, wherein the coating comprises a Si—C—N-based layer having element composition in atomic percentage corresponding to $Si_aC_bN_cX_d$ with $50<a+b+c<100$, $0<d<60$, wherein X consists of hydrogen and oxygen and optionally further consists of at least one of the group consisting of titanium, chromium, and aluminum, and
   the coating further comprises a hard-thin film layer that is deposited between the substrate surface and the Si—C—N-based layer, wherein the hard-thin film layer is selected from the group consisting of a metal nitride layer, a metal oxide layer, a metal oxynitride layer, a metal carboxynitride layer, and a metal carbonitride layer, wherein the hard-thin film layer has a chemical composition in atomic percentage corresponding to the formula $Me\,(C_vN_yO_z)_q$, with Me being one or more elements selected from the group consisting of chromium, aluminum, titanium, vanadium and molybdenum, and with atomic fractions v, y and z of carbon, nitrogen and oxygen, respectively, having a value in the following ranges $0\leq v\leq1$, $0\leq y\leq1$, $0\leq z\leq1$, with $v+y+z=1$, and with mol concentration q of the nonmetallic elements C, N and O in relation to one mol of the metallic elements Me in the following range $0.76\leq q\leq1.2$.

2. Coated forming tool according to claim 1, wherein X consists of hydrogen and oxygen and at least one of the group consisting of titanium, chromium, and aluminum.

3. Coated forming tool according to claim 1, wherein the coating is formed of more than one layer and the Si—C—N-based layer is deposited as an outermost layer.

4. Coated forming tool according to claim 1, wherein the substrate surface comprises a nitriding layer, on which the coating is deposited.

5. Coated forming tool according to claim 1, wherein an adhesion layer is deposited between the substrate surface and the coating.

6. Method for producing a coated forming tool according to claim 1, comprising depositing the Si—C—N-based layer using PE-CVD techniques, and using an Si-containing gas as a precursor.

7. Method according to claim 6, wherein the Si-containing gas is hexamethyldisiloxane (HMDSO).

8. Method according to claim 6, wherein before deposition of the silicon carbonitride layer, the substrate to be coated is subjected to a plasma nitriding process for forming a nitriding layer comprising the substrate surface on which the coating is deposited.

9. A method of carrying out a plastics processing operation, comprising using the coated forming tool according to claim 1 to form an object made of plastic.

10. The method according to claim 9, wherein the plastics processing operation is plastics injection molding.

11. A method of carrying out an aluminum or aluminum alloy processing operation, comprising using the coated forming tool according to claim 1 to form an object made of aluminum or aluminum alloy.

12. The method according to claim 11, wherein the aluminum or aluminum alloy processing operation is aluminum die casting or aluminum alloy die casting.

* * * * *